(12) United States Patent
Shih et al.

(10) Patent No.: US 9,520,333 B1
(45) Date of Patent: Dec. 13, 2016

(54) WAFER LEVEL PACKAGE AND FABRICATION METHOD THEREOF

(71) Applicant: INOTERA MEMORIES, INC., Taoyuan (TW)

(72) Inventors: Shing-Yih Shih, New Taipei (TW); Neng-Tai Shih, New Taipei (TW); Hsu Chiang, New Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 51 days.

(21) Appl. No.: 14/745,473

(22) Filed: Jun. 22, 2015

(51) Int. Cl.
*H05K 1/18* (2006.01)
*H01L 23/31* (2006.01)
*H01L 23/498* (2006.01)

(52) U.S. Cl.
CPC ......... *H01L 23/3171* (2013.01); *H01L 23/498* (2013.01); *H01L 23/49811* (2013.01); *H01L 23/49894* (2013.01); *H05K 1/181* (2013.01)

(58) Field of Classification Search
None
See application file for complete search history.

(56) References Cited

U.S. PATENT DOCUMENTS

| | | | | |
|---|---|---|---|---|
| 2013/0309813 A1* | 11/2013 | Shih | ...................... | H01L 21/486 438/118 |
| 2014/0036454 A1* | 2/2014 | Caskey | ................ | H05K 1/0298 361/735 |
| 2014/0070406 A1* | 3/2014 | Mohammed | ........ | H01L 25/0652 257/737 |
| 2015/0327367 A1* | 11/2015 | Shen | ...................... | H05K 1/111 361/767 |
| 2015/0380334 A1* | 12/2015 | Hu | .......................... | H01L 23/36 257/712 |

FOREIGN PATENT DOCUMENTS

TW 201526125 A 7/2015

* cited by examiner

*Primary Examiner* — Courtney Smith
*Assistant Examiner* — Jessey R Ervin
(74) *Attorney, Agent, or Firm* — Winston Hsu; Scott Margo

(57) ABSTRACT

A semiconductor device includes a semiconductor device includes an interposer having a first side and a second side opposite to the first side, wherein the interposer comprises a redistribution layer (RDL), and the RDL comprises a first passivation layer on the first side and a second passivation layer on the second side; at least one active chip mounted on the first passivation layer on the first side through a plurality of first bumps penetrating through the first passivation layer; a molding compound disposed on the first side, the molding compound covering the at least one active chip and a top surface of the first passivation layer; and a plurality of solder bumps mounted on the first passivation layer on the second side.

13 Claims, 13 Drawing Sheets

WAFER LEVEL PACKAGE AND FABRICATION METHOD THEREOF

BACKGROUND OF THE INVENTION

1. Field of the Invention

The present invention relates generally to the field of semiconductor packaging, and more particularly to a wafer level package (WLP) with a substrate-less or TSV-less (TSV: Through Substrate Via) interposer and a method for manufacturing the same.

2. Description of the Prior Art

With recent advancements in the semiconductor manufacturing technology microelectronic components are becoming smaller and circuitry within such components is becoming increasingly dense. To reduce the dimensions of such components, the structures by which these components are packages and assembled with circuit boards must become more compact.

As known in the art, fan-out wafer-level packaging (FOWLP) is a packaging process in which contacts of a semiconductor die are redistributed over a larger area through a redistribution layer (RDL) that is typically formed on a substrate such as a TSV interposer.

The RDL is typically defined by the addition of metal and dielectric layers onto the surface of the wafer to re-route the I/O layout into a looser pitch footprint. Such redistribution requires thin film polymers such as BCB, PI or other organic polymers and metallization such as Al or Cu to reroute the peripheral pads to an area array configuration.

The TSV interposer is costly because fabricating the interposer substrate with TSVs is a complex process. Thus, forming FOWLP products that includes an interposer having a TSV interposer may be undesirable for certain applications.

SUMMARY OF THE INVENTION

In one aspect of the invention, a semiconductor device includes a semiconductor device includes an interposer having a first side and a second side opposite to the first side, wherein the interposer comprises a redistribution layer (RDL), and the RDL comprises a first passivation layer on the first side and a second passivation layer on the second side; at least one active chip mounted on the first passivation layer on the first side through a plurality of first bumps penetrating through the first passivation layer; a molding compound disposed on the first side, the molding compound covering the at least one active chip and a top surface of the first passivation layer; and a plurality of solder bumps mounted on the first passivation layer on the second side.

According to one embodiment of the invention, the RDL further comprises a first interlayer dielectric between the first passivation layer and the second passivation layer, a first dielectric block layer between the first interlayer dielectric and the second passivation layer.

According to one embodiment of the invention, the RDL further comprises a second interlayer dielectric between the first passivation layer and first interlayer dielectric, a second dielectric block layer between the first interlayer dielectric and the second interlayer dielectric.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
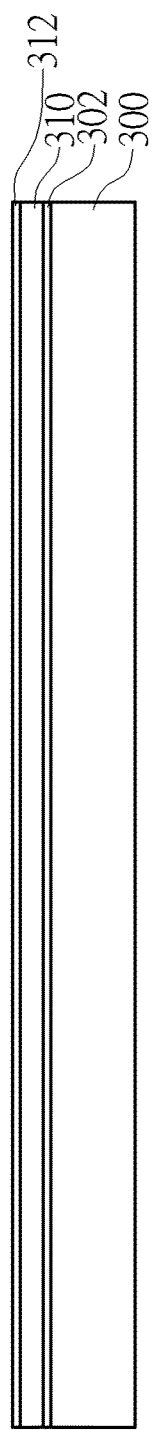
FIG. 1 to FIG. 9 are chematic diagrams showing an exemplary method for fabricating a wafer level package (WLP) with a substrate-less (or TSV-less) interposer according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die", "semiconductor chip", and "semiconductor die" are used interchangeable throughout the specification.

The terms wafer and substrate used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

Please refer to FIG. 1 to FIG. 9. FIG. 1 to FIG. 9 are schematic diagrams showing an exemplary method for fabricating a wafer level package (WLP) with a substrate-less (or TSV-less) interposer according to one embodiment of the invention.

As shown in FIG. 1, a carrier 300 is prepared. The carrier 300 may be a wafer-like glass substrate with an adhesive layer or a release layer 302 laminated on a top surface of the glass substrate. At least a passivation layer 310 is formed on the release layer 302. The passivation layer 310 may comprise silicon nitride, silicon oxide, silicon oxynitride or a combination thereof. A dielectric capping layer or a dielectric block layer 312 is then deposited on the passivation layer 310 in blanket fashion. The dielectric block layer 312 may comprise a material that is able to prevent copper diffusion. For example, the dielectric block layer 312 may comprise silicon nitride, but not limited thereto.

Figure 2:
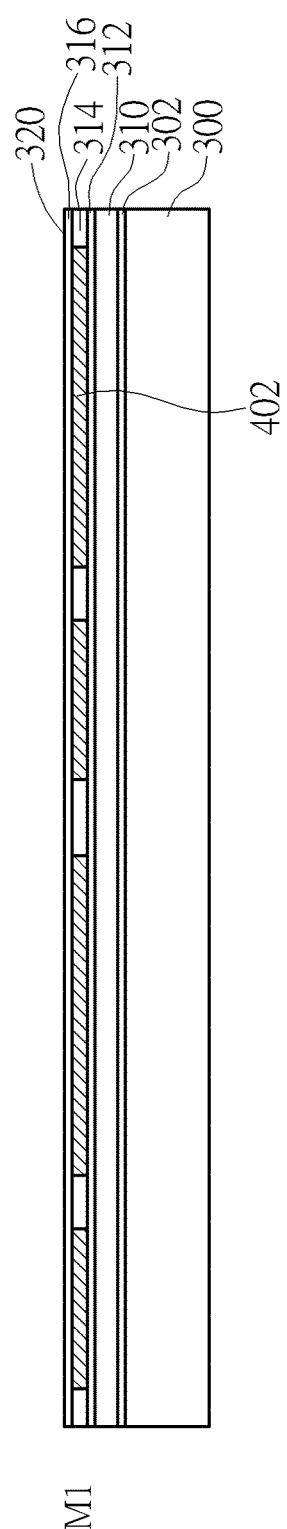

As shown in FIG. 2, an interlayer dielectric layer (ILD) 314 is deposited on the dielectric block layer 312. The ILD 314 may comprise silicon oxide, BSG, BPSG, or low-k dielectric materials known in the art. A copper damascene process is then performed to form damascened copper layer 402 in the ILD 314. A dielectric block layer 316 is then deposited on the ILD 314 and the damascened copper layer 318.

The copper damascene process is known in the art. For example, to form the damascened copper layer 402 in the ILD 314, a lithographic process and an etching process are performed to form trenches in the ILD 314, a diffusion barrier metal and copper are then deposited into the trenches, then the deposited metals are polished by using chemical mechanical polishing (CMP) methods. The damascened copper layer 402 forms a first metal level (M1) in the RDL interposer.

Figure 3:
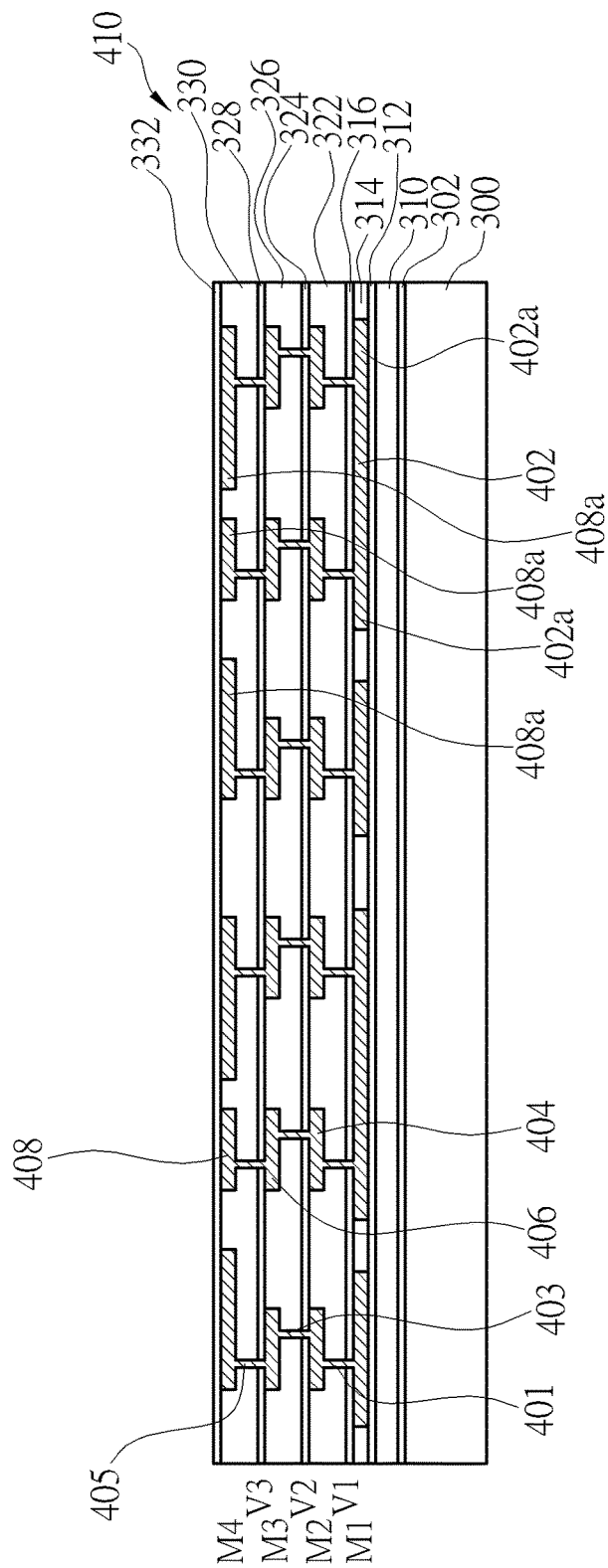

As shown in FIG. 3, subsequently, similar copper damascene process as set forth in FIG. 2 is performed to form a redistribution layer (RDL) 410 on the passivation layer 310. For example, the RDL 410 comprises four levels (M1~M4/V1~V3) of metal interconnection formed by copper damascene process. It is understood that the four levels (M1~M4/V1~V3) of metal interconnection are for illustration purposes only. For example, in some cases, only one or two metal levels may be employed depending upon the design requirements.

The RDL 410 may comprise a dielectric stack including the passivation layer 310, the dielectric block layer 312, the ILD 314, the dielectric block layer 316, ILD 322, dielectric block layer 324, ILD 326, dielectric block layer 328, dielectric block layer 330, and dielectric block layer 332. Damascened copper layers 402, 404, 406, 408 and vias 401, 403, 405 are formed in the dielectric stack. The vias 401, 403, 405 penetrate through respective dielectric block layers 316, 324, 328 to electrically connected to the underlying damascened copper layers.

According to the illustrated embodiment, the metal layer 414 may comprise a plurality of bump pads 408a exposed from a top surface of the ILD 330. The bump pads 408a are disposed within a chip mounting area. At this point, the metal layer 414 and the ILD 330 are covered with the topmost dielectric block layer 332.

Figure 4:
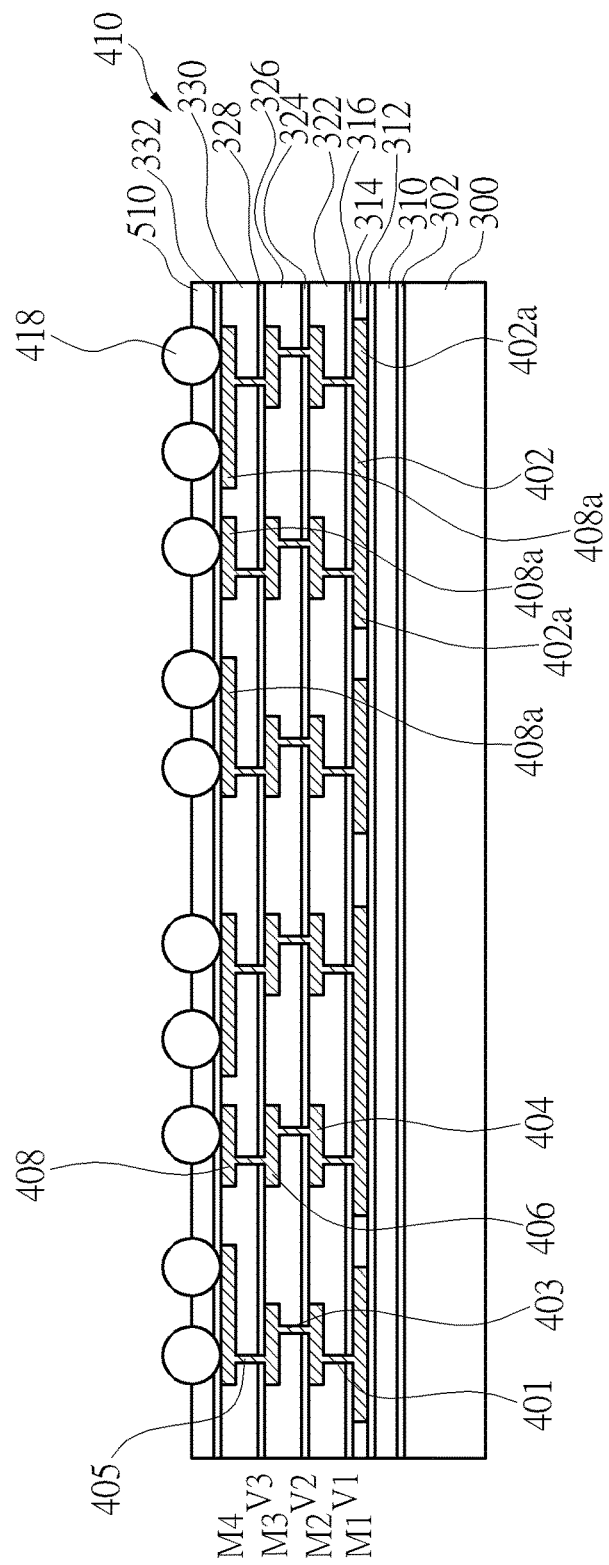

As shown in FIG. 4, a passivation layer 510 is then deposited on the topmost dielectric block layer 332. The passivation layer 510 may comprise silicon nitride, silicon oxide, silicon oxynitride or a combination thereof. However, it is understood that the passivation layer 510 may comprise organic material, for example, polyimide (PI), benzocyclobutene (BCB), polybenzoxazole (PBO), or the like. A plurality of bumps 418 such as micro-bumps may be formed on the bump pads 408a for further connections. For example, a lithographic process and an etching process may be performed to form openings in the passivation layer 510 and the topmost dielectric block layer 332 to thereby expose respective bump pads 408a. Thereafter, under bump metal (UBM) may be formed in the openings, and then solder bumps or balls are formed on the respective bump pads 408a.

Figure 5:
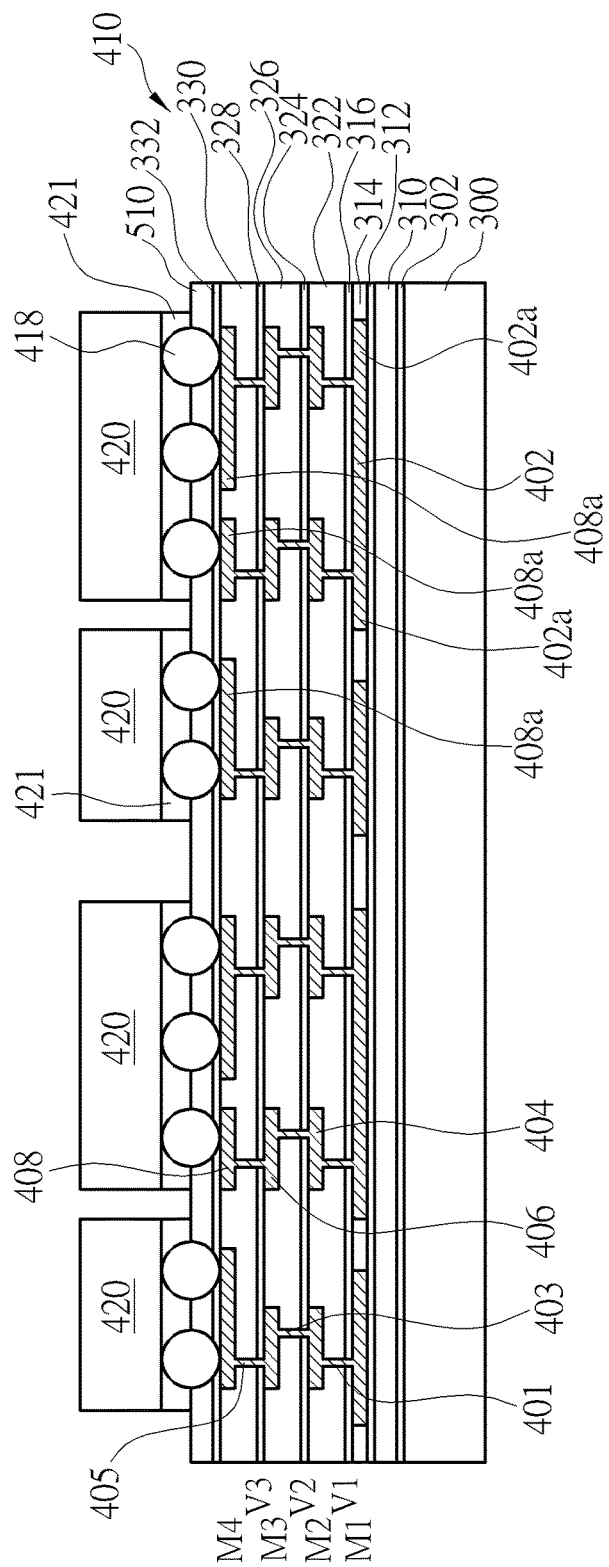

As shown in FIG. 5, after the formation of the bumps 418, individual flip-chips or dies 420 with their active sides facing down toward the RDL 410 are then mounted on the RDL 410 through the bumps 418 to thereby forming a stacked chip-to-wafer (C2W) construction. These individual flip-chips or dies 420 may comprise active integrated circuit chips with certain functions, for example, GPU (graphic processing unit), CPU (central processing unit), memory chips, etc. Optionally, an underfill 421 may be applied under each chip or die 420. Thereafter, a thermal process may be performed to reflow the bumps 418.

Figure 6:
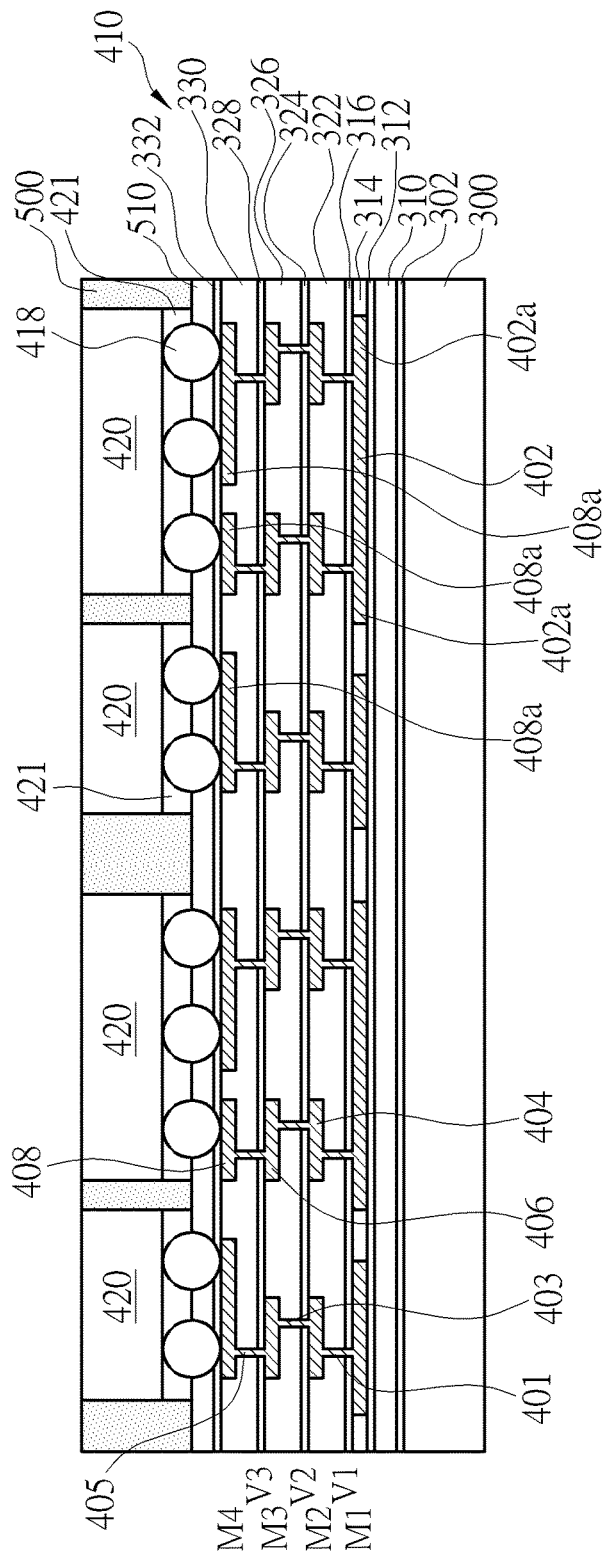

As shown in FIG. 6, after the die-bonding process, a molding compound 500 is applied. The molding compound 500 covers the attached chips 420 and the top surface of the RDL 410. The molding compound 500 may be subjected to a curing process. The mold compound 500 may comprise a mixture of epoxy and silica fillers, but not limited thereto. Optionally, a top portion of the molding compound 500 may be polished away to expose a top surfaces of the chips 420.

Figure 7:
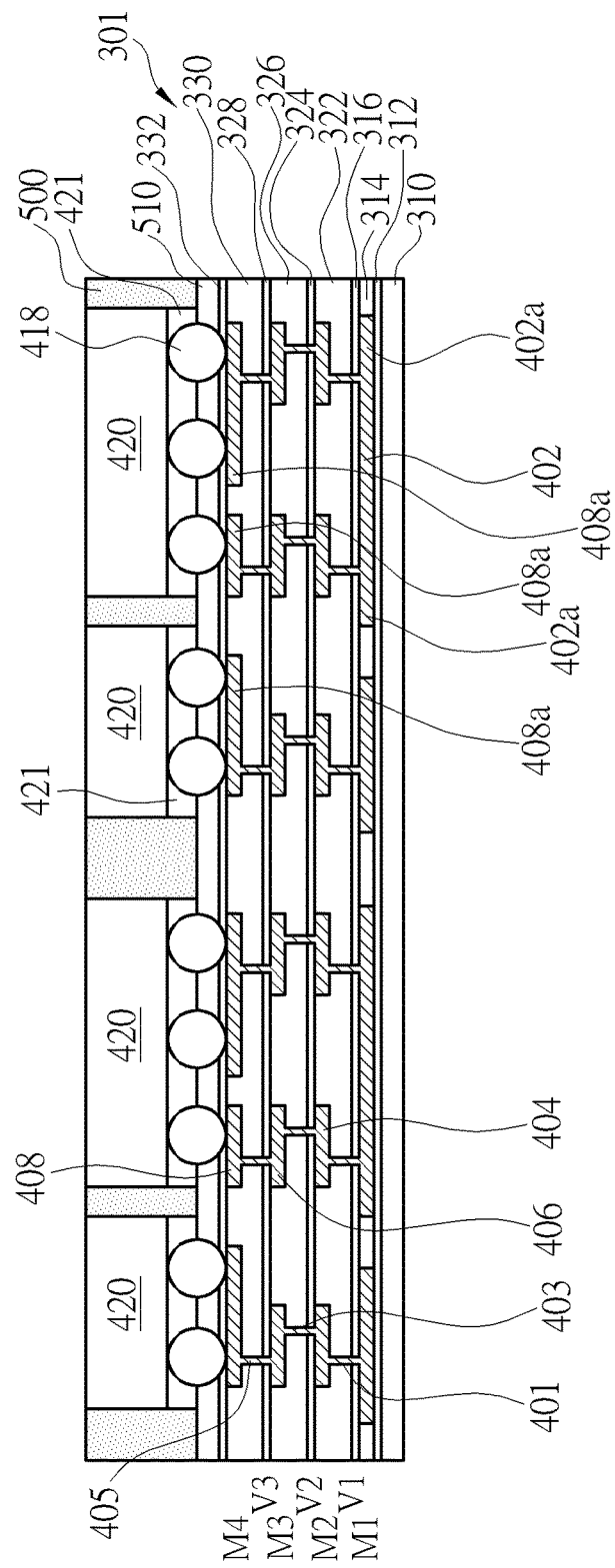

As shown in FIG. 7, after the formation of the molding compound 500, the carrier 300 is removed or peeled off to expose the passivation layer 310, thereby forming a TSV-less interposer 301 comprising the RDL 410. The release layer 302 is also removed to expose the lower surface of the passivation layer 310. The de-bonding of the carrier 300 may be performed by using a laser process or UV irradiation process, but not limited thereto. To peel off the carrier 300, another temporary carrier substrate (not shown) may be attached to the molding compound 500.

Figure 8:
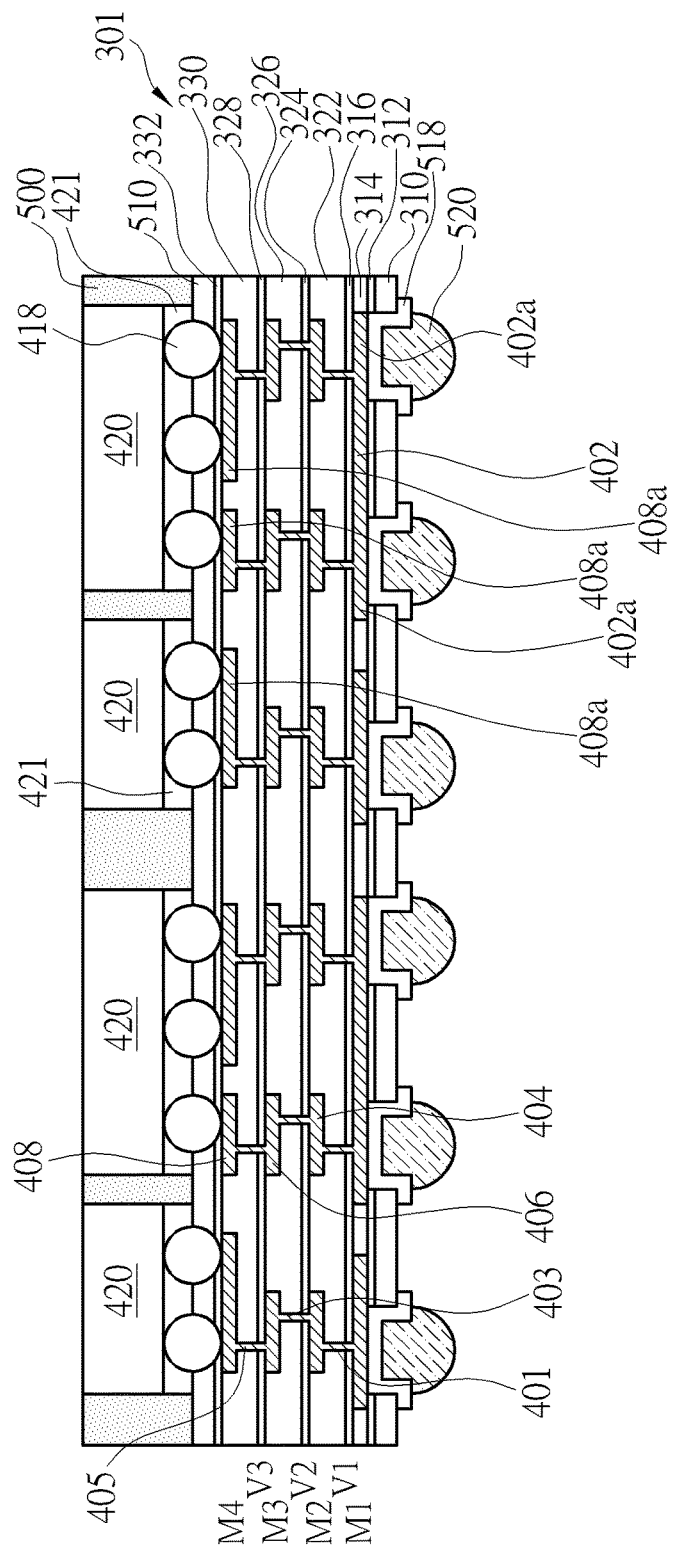

Thereafter, as shown in FIG. 8, after the de-bonding of the carrier 300, openings may be formed in the passivation layer 310 and the dielectric block layer 312 to expose respective solder pads 402a, and then solder bumps or solder balls 520 may be formed on the respective solder pads 402a. For example, before forming the solder balls 520, UBM 518 may be formed in the openings.

Figure 9:
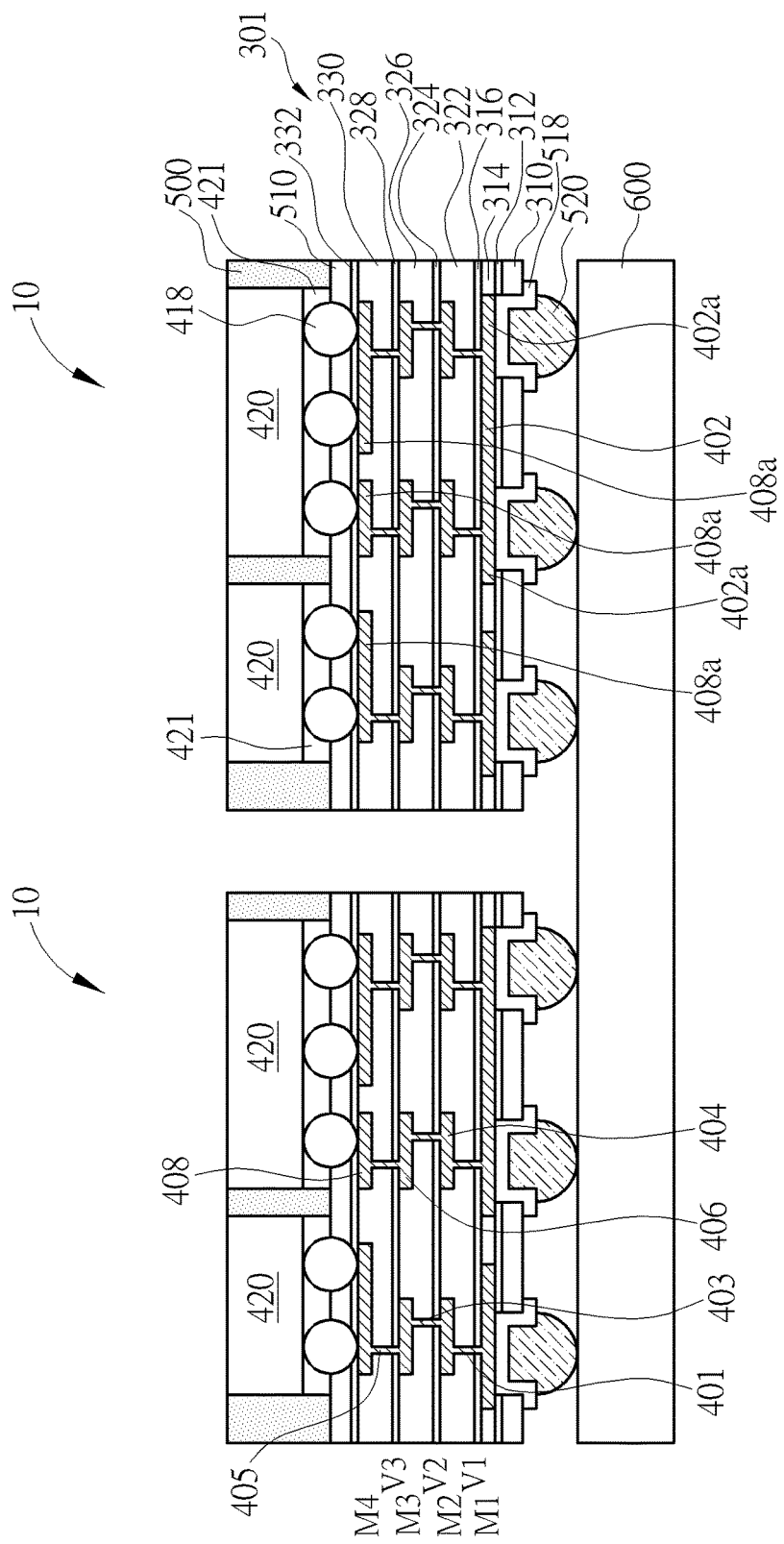

Thereafter, as shown in FIG. 9, a dicing process is performed to separate individual wafer level packages 10 from one another. For example, the wafer level package may be first attached to a dicing tape (not shown), where the solder balls 520 face toward, and may contact, a dicing tape 600. It is understood that although two chips are shown in FIG. 9 in each wafer level packages 10, each package may comprise only one chip in some cases.

Figure 10:
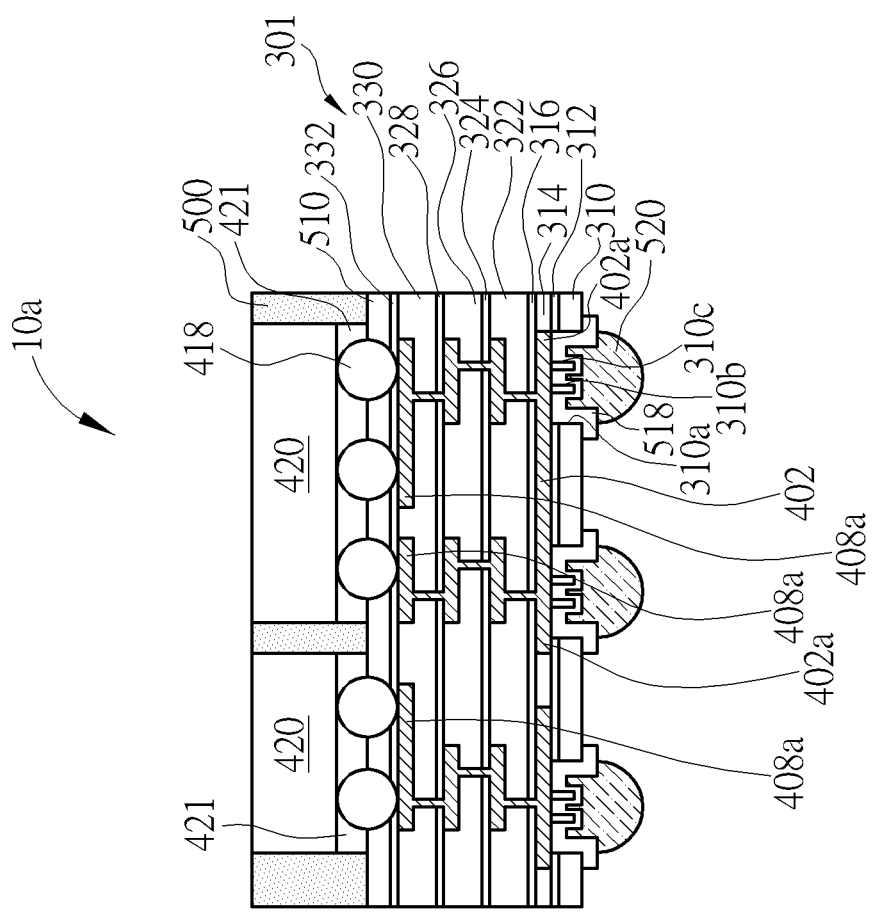
FIG. 10 is a schematic, cross-sectional diagram showing a wafer level package according to another embodiment of the invention.

FIG. 10 is a schematic, cross-sectional diagram showing a wafer level package according to another embodiment of the invention. The difference between the wafer level package 10a in FIG. 10 and the wafer level package 10 in FIG. 9 is that a plurality of openings 310a, 310b, and 310c is formed on each of the solder pads 402a to release the stress of the solder balls 520.

Figure 11:
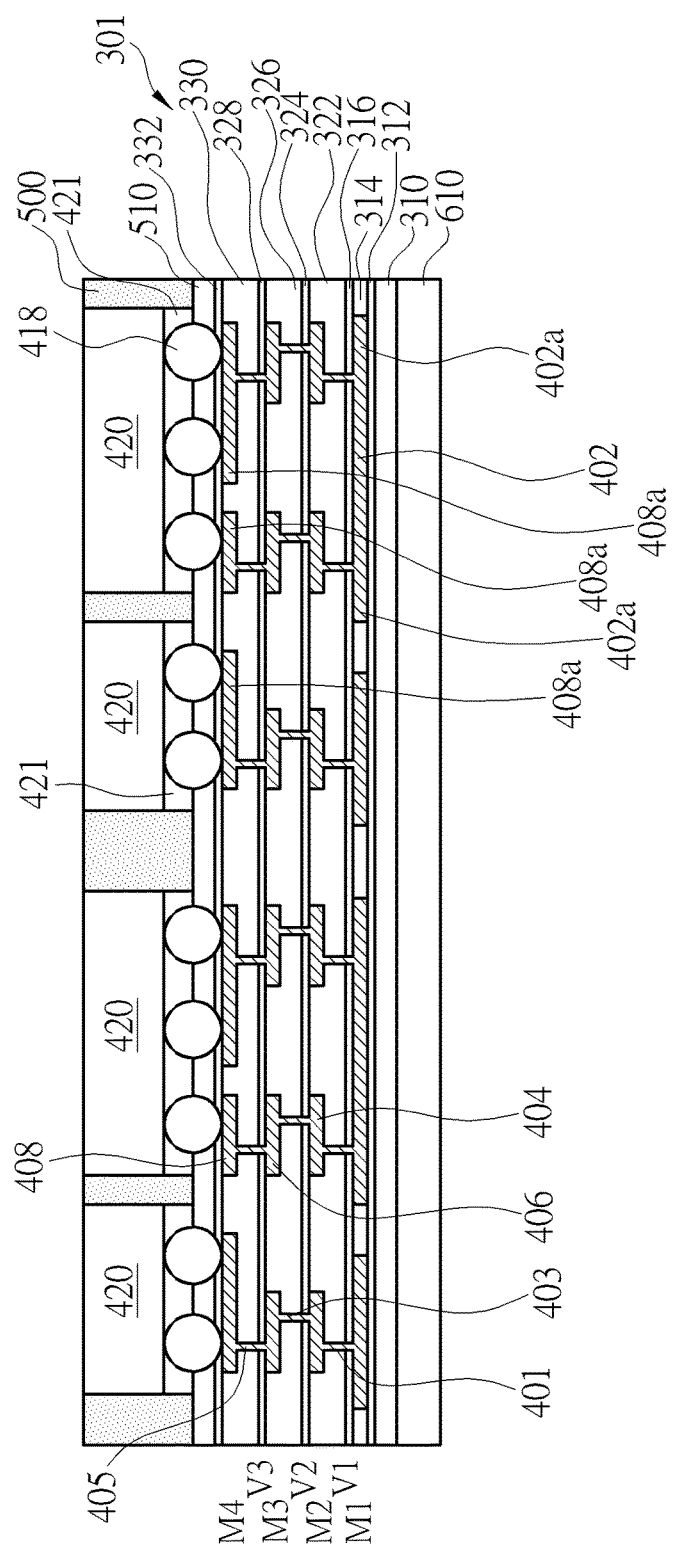
FIG. 11 to FIG. 13 illustrate another embodiment of the invention.
Figure 12:
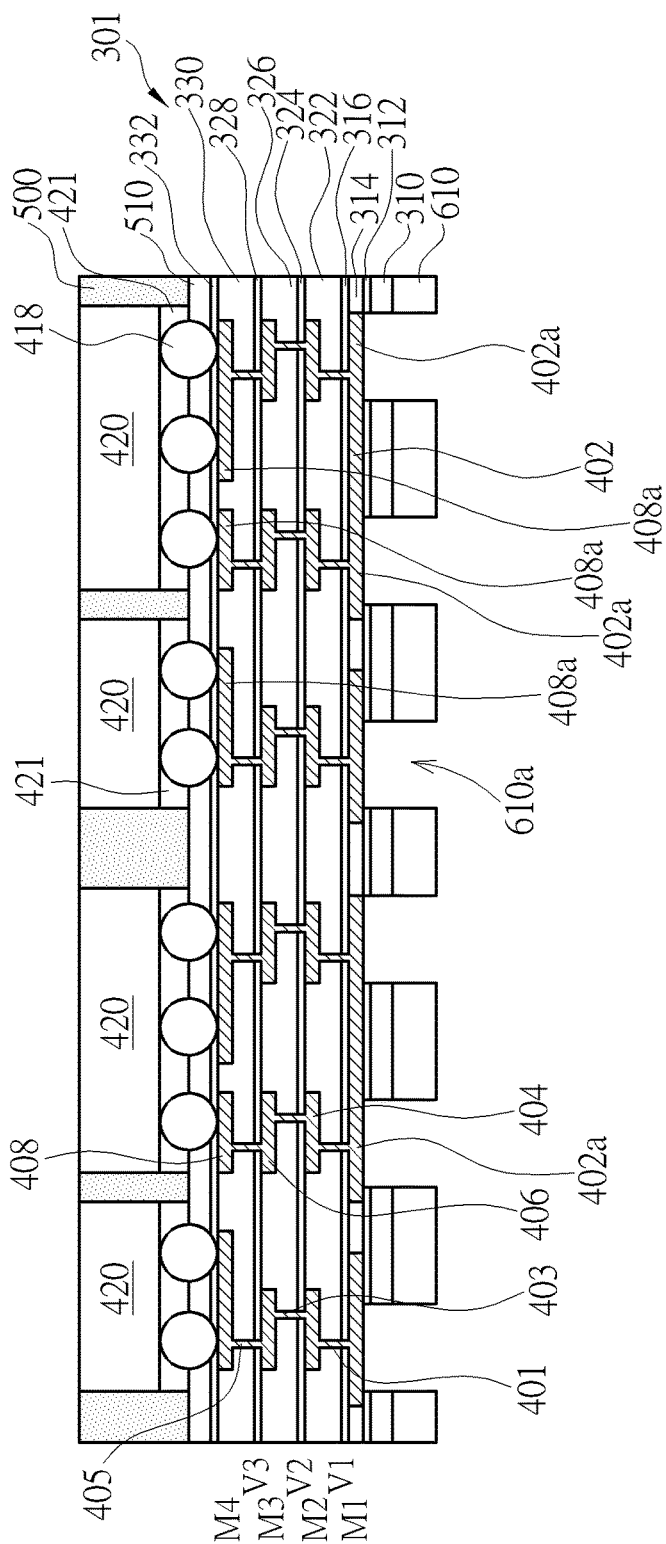
Figure 13:
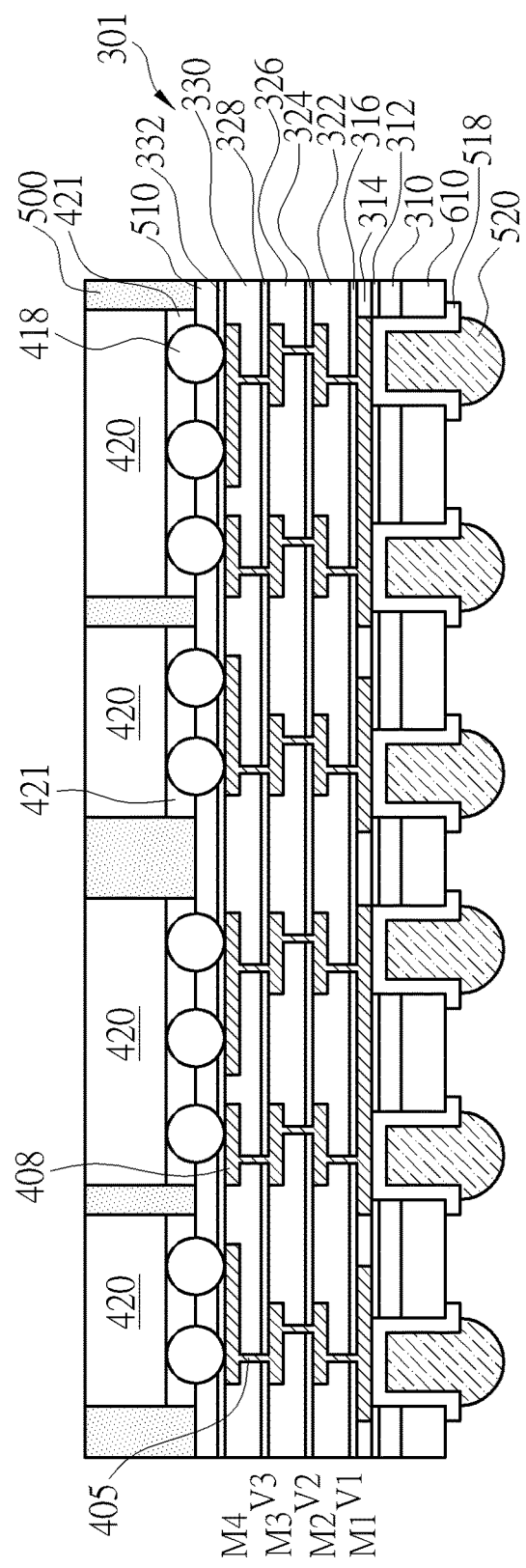

FIG. 11 to FIG. 13 illustrate another embodiment of the invention. As shown in FIG. 11, after the formation of the molding compound 500, likewise, the carrier 300 is removed or peeled off to expose the passivation layer 310, thereby forming a TSV-less interposer 301 comprising the RDL 410. The release layer 302 is also removed to expose the lower surface of the passivation layer 310. The de-bonding of the carrier 300 may be performed by using a laser process or UV irradiation process, but not limited thereto. To peel off the carrier 300, another temporary carrier substrate (not shown) may be attached to the molding compound 500.

According to the illustrated embodiment, for a solder ball having a relatively larger dimension such as ball grid array (BGA) balls having a diameter larger than 200 micrometers, an organic dielectric layer 610 is laminated on the exposed lower surface of the passivation layer 310. According to the illustrated embodiment, the organic dielectric layer 610 may comprise polyimide (PI), benzocyclobutene (BCB), polybenzoxazole (PBO), or the like.

As shown in FIG. 12, after the deposition of the organic dielectric layer 610, openings 610a may be formed in the organic dielectric layer 610, the passivation layer 310, and the dielectric block layer 312 to expose respective solder pads 402a.

As shown in FIG. 13, solder bumps or solder balls 520 may be formed on the respective solder pads 402a. For example, before forming the solder balls 520, UBM 518 may be formed in the openings 610a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   an interposer having a first side and a second side opposite to the first side, wherein the interposer comprises a redistribution layer (RDL), and the RDL comprises a first passivation layer on the first side and a second passivation layer on the second side;
   at least one active chip mounted on the first passivation layer on the first side through a plurality of first bumps penetrating through the first passivation layer;
   a molding compound disposed on the first side, the molding compound covering the at least one active chip and a top surface of the first passivation layer; and
   a plurality of solder bumps mounted on the first passivation layer on the second side.

2. The semiconductor device according to claim 1, wherein the first passivation layer comprises silicon nitride, silicon oxide, silicon oxynitride or a combination thereof.

3. The semiconductor device according to claim 1, wherein the second passivation layer comprises silicon nitride, silicon oxide, silicon oxynitride or a combination thereof.

4. The semiconductor device according to claim 1, wherein the RDL further comprises a first interlayer dielectric between the first passivation layer and the second passivation layer, a first dielectric block layer between the first interlayer dielectric and the second passivation layer.

5. The semiconductor device according to claim 4, wherein the first interlayer dielectric comprises silicon oxide, BSG, or BPSG.

6. The semiconductor device according to claim 4, wherein the first dielectric block layer comprises silicon nitride.

7. The semiconductor device according to claim 4, wherein a first metal layer is embedded in the first interlayer dielectric.

8. The semiconductor device according to claim 7, wherein the RDL further comprises a second interlayer dielectric between the first passivation layer and first interlayer dielectric, a second dielectric block layer between the first interlayer dielectric and the second interlayer dielectric.

9. The semiconductor device according to claim 8, wherein the second interlayer dielectric comprises silicon oxide, BSG, or BPSG.

10. The semiconductor device according to claim 8, wherein the second dielectric block layer comprises silicon nitride.

11. The semiconductor device according to claim 8, wherein the RDL further comprises a second metal layer and a first via in the second interlayer dielectric, wherein the second metal layer is electrically connected to the first metal layer through the first via.

12. The semiconductor device according to claim 8, wherein the RDL further comprises a third dielectric block layer between the second interlayer dielectric and the first passivation layer.

13. The semiconductor device according to claim 12, wherein the third dielectric block layer comprises silicon nitride.

* * * * *